US008766375B2

(12) United States Patent
Bramian et al.

(10) Patent No.: US 8,766,375 B2
(45) Date of Patent: Jul. 1, 2014

(54) COMPOSITE SEMICONDUCTOR DEVICE WITH ACTIVE OSCILLATION PREVENTION

(75) Inventors: Tony Bramian, Torrance, CA (US); Jason Zhang, Monterey Park, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/417,143

(22) Filed: Mar. 9, 2012

(65) Prior Publication Data

US 2013/0234208 A1    Sep. 12, 2013

(51) Int. Cl.
*H01L 27/088*    (2006.01)
*H01L 21/8236*   (2006.01)

(52) U.S. Cl.
CPC ........ *H01L 27/0883* (2013.01); *H01L 21/8236* (2013.01)
USPC ............. 257/392; 257/E27.061; 257/E21.631

(58) Field of Classification Search
CPC .................... H01L 27/0883; H01L 21/8236
USPC ........................... 257/392, E27.061, E21.631
See application file for complete search history.

(56) References Cited

U.S. PATENT DOCUMENTS

| 4,663,547 | A  | 5/1987  | Baliga  |
|-----------|----|---------|---------|
| 5,939,753 | A  | 8/1999  | Ma      |
| 7,291,872 | B2 | 11/2007 | Hikita  |
| 7,501,670 | B2 | 3/2009  | Murphy  |
| 7,719,055 | B1 | 5/2010  | McNutt  |
| 7,777,254 | B2 | 8/2010  | Sato    |
| 7,915,645 | B2 | 3/2011  | Briere  |
| 8,084,783 | B2 | 12/2011 | Zhang   |
| 8,368,120 | B2 | 2/2013  | Lidow   |
| 2001/0024138 | A1 | 9/2001  | Dohnke |
| 2003/0011436 | A1 | 1/2003  | Shigematsu |
| 2006/0060895 | A1 | 3/2006  | Hikita |
| 2006/0113593 | A1 | 6/2006  | Sankin |
| 2006/0175627 | A1 | 8/2006  | Shiraishi |
| 2007/0046379 | A1 | 3/2007  | Tanahashi |
| 2007/0170897 | A1 | 7/2007  | Williams |
| 2007/0210333 | A1 | 9/2007  | Lidow |
| 2007/0215899 | A1 | 9/2007  | Herman |
| 2007/0228401 | A1 | 10/2007 | Machida |
| 2008/0191216 | A1 | 8/2008  | Machida |
| 2008/0230784 | A1 | 9/2008  | Murphy |

(Continued)

FOREIGN PATENT DOCUMENTS

EP    2 242 103    10/2010
JP    3-196572     8/1991

(Continued)

OTHER PUBLICATIONS

U.S. Appl. No. 61/448,617, filed Mar. 2, 2011, Lin.

(Continued)

*Primary Examiner* — Amar Movva
(74) *Attorney, Agent, or Firm* — Farjami & Farjami LLP

(57) ABSTRACT

There are disclosed herein various implementations of composite semiconductor devices with active oscillation control. In one exemplary implementation, a normally OFF composite semiconductor device comprises a normally ON III-nitride power transistor and a low voltage (LV) device cascoded with the normally ON III-nitride power transistor to form the normally OFF composite semiconductor device. The LV device may be configured to include one or both of a reduced output resistance due to, for example, a modified body implant and a reduced transconductance due to, for example, a modified oxide thickness to cause a gain of the composite semiconductor device to be less than approximately 10,000.

17 Claims, 3 Drawing Sheets

(56) References Cited

U.S. PATENT DOCUMENTS

| | | |
|---|---|---|
| 2011/0018625 A1 | 1/2011 | Hodel |
| 2011/0140169 A1 | 6/2011 | Briere |
| 2011/0210337 A1 | 9/2011 | Briere |
| 2012/0105131 A1 | 5/2012 | Biela |
| 2013/0062671 A1 | 3/2013 | Saito |

FOREIGN PATENT DOCUMENTS

| | | |
|---|---|---|
| JP | 8-308092 | 11/1996 |
| JP | 2006-351691 | 12/2006 |
| JP | 2008-243943 | 10/2008 |
| JP | 2009-38130 | 2/2009 |
| JP | 2010-94006 | 4/2010 |
| JP | 2010-522432 | 7/2010 |
| JP | 2010-278280 | 12/2010 |
| JP | 2010-283346 | 12/2010 |
| JP | 2011-29386 | 2/2011 |
| WO | WO 2008/116038 | 9/2008 |

OTHER PUBLICATIONS

U.S. Appl. No. 61/448,347, filed Mar. 2, 2011, Lin.
U.S. Appl. No. 61/339,190, filed Mar. 1, 2010, Briere.
Ashot Melkonyan, "High Efficiency Power Supply using new SiC devices", 2007, Kassel University Press GmbH, pp. 1-3, 105-106.

US 8,766,375 B2

COMPOSITE SEMICONDUCTOR DEVICE WITH ACTIVE OSCILLATION PREVENTION

BACKGROUND

The present application claims the benefit of and priority to a pending provisional application entitled "III-Nitride Optimized Rugged Cascode Power Device," Ser. No. 61/454,743 filed on Mar. 21, 2011. The disclosure in this pending provisional application is hereby incorporated fully by reference into the present application.

DEFINITIONS

As used herein, the phrase "III-nitride" or "III-N" refers to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-nitride also refers generally to any polarity including but not limited to Ga-polar, N-polar, semi-polar or non-polar crystal orientations. A III-nitride material may also include either the Wurtzitic, Zincblende or mixed polytypes, and may include single-crystal, monocrystal, polycrystal, or amorphous crystal structures.

Also, as used herein, the terms "LV-device," "low voltage semiconductor device," "low voltage transistor," and the like, refer to a low voltage device, with a typical voltage range of up to approximately 50 volts. Typical voltage ratings include low voltage (LV) ~0-50V, midvoltage (MV) ~50-200V, high voltage (HV) ~200-1200V and ultra high voltage (UHV)~>1200V. The device can comprise any suitable semiconductor material that forms a field-effect transistor (FET) or diode, or a combination of a FET and a diode. Suitable semiconductor materials include group IV semiconductor materials such as silicon, strained silicon, SiGe, SiC, and group III-V materials including III-As, III-P, III-nitride or any of their alloys.

BACKGROUND ART

III-nitride materials are semiconductor compounds that have a relatively wide, direct bandgap and potentially strong piezoelectric polarizations, and can enable high breakdown fields, high saturation velocities, and the creation of two-dimensional electron gases (2-DEGs). As a result, III-nitride materials are used in many power applications such as depletion mode (e.g., normally ON) power field-effect transistors (power FETs), high electron mobility transistors (HEMTs), and diodes.

In power management applications where normally OFF characteristics of power devices are desirable, a depletion mode III-nitride power transistor can be cascoded with a low voltage (LV) semiconductor device to produce an enhancement mode composite power device. However, the utility and durability of such a composite device can be limited according to characteristics of the III-nitride power transistor and LV semiconductor device being used in combination. For example, when implemented with an LV semiconductor device to form a composite device used in high current applications, the gate of the III-nitride power transistor may tend to oscillate when configured in series with semiconductor package inductances and the output capacitance of the LV semiconductor device, for example, causing the III-nitride power transistor to be undesirably turned OFF and ON. Unless controlled and dampened, such oscillations may adversely affect the functionality and utility of the composite semiconductor device, and can also be destructive and reduce the durability of the composite semiconductor device.

SUMMARY

The present disclosure is directed to a composite semiconductor device with active oscillation prevention, substantially as shown in and/or described in connection with at least one of the figures, and as set forth more completely in the claims.

DETAILED DESCRIPTION

Figure 1:
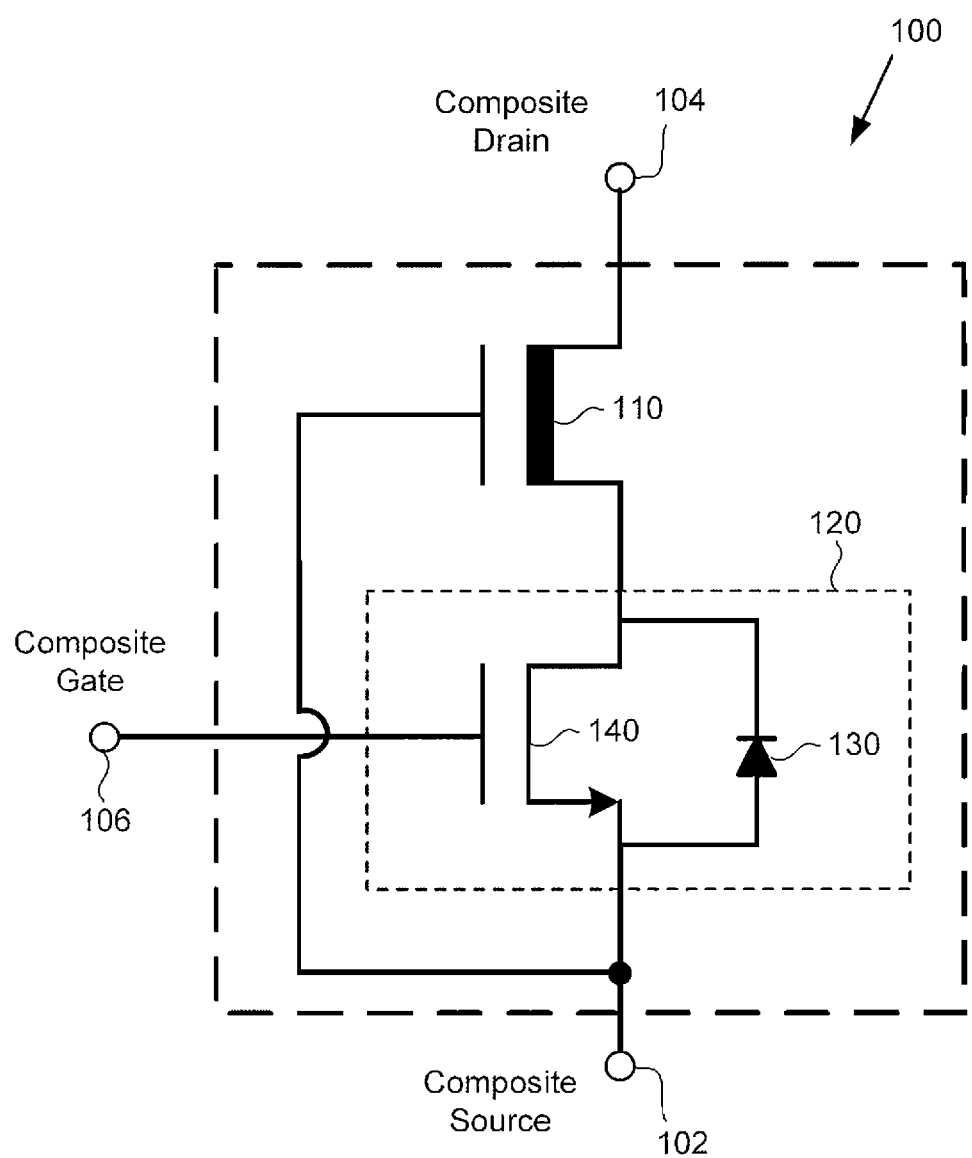
FIG. 1 presents a diagram showing one exemplary implementation of a composite semiconductor device.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

III-nitride materials include, for example, gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields, high saturation velocities, and the creation of two-dimensional electron gases (2-DEGs). As a result, and as noted above, III-nitride materials such as GaN are used in many microelectronic applications such as depletion mode (e.g., normally ON) power field-effect transistors (power FETs), high electron mobility transistors (HEMTs), and diodes.

As further noted above, in power management applications where normally OFF characteristics of power devices are desirable, a depletion mode III-nitride power transistor can be cascoded with a low voltage (LV) semiconductor device to produce an enhancement mode composite power device. However, the utility and durability of such a composite device can be limited according to characteristics of the III-nitride power transistor and LV semiconductor device being cascoded together. For example, when implemented in combination with an LV semiconductor device to form a composite device used in high current applications, the gate of the III-nitride power transistor may tend to oscillate when configured in series with semiconductor package inductances and the output capacitance of the LV semiconductor device, for example, causing the III-nitride power transistor to be turned OFF and ON. Unless controlled, such oscillations can be destructive, and may undesirably reduce the durability of the composite semiconductor device. Thus, in order to render such composite semiconductor devices suitable for operation in power management systems, where high slew rate conditions may be encountered, the composite device should be configured so as to be oscillation resistant.

The present application is directed to a composite semiconductor device with active oscillation control. According to one implementation, the composite semiconductor device may include a III-nitride power transistor, which may be a normally ON device, for example, and an LV device cascoded with the III-nitride power transistor. \The cascoded combination of the LV device and the normally ON III-nitride power transistor can be implemented to produce a normally OFF composite semiconductor device. As disclosed herein, the LV device cascoded with the normally ON III-nitride power transistor can be configured so as to limit the gain of the composite semiconductor device to provide active oscillation control for the normally OFF composite semiconductor device.

Referring to FIG. 1, FIG. 1 shows an exemplary implementation of a composite semiconductor device. As shown in FIG. 1, composite semiconductor device 100 includes III-nitride power transistor 110 and LV device 120 cascoded with III-nitride power transistor 110. As further shown in FIG. 1, LV device 120 includes LV transistor 140 and LV diode 130. Also shown in FIG. 1 are composite source 102, composite drain 104, and composite gate 106 of composite semiconductor device 100. III-nitride power transistor 110 may be formed of gallium nitride (GaN), and may be implemented as an insulated-gate FET (IGFET) or as a heterostructure FET (HIFET), for example. In one implementation, III-nitride power transistor 110 may take the form of a metal-insulator-semiconductor FET (MISFET or MIST-WET), such as a metal-oxide-semiconductor FET (MOSFET). Alternatively, when implemented as an HFET, III-nitride power transistor 110 may be a HEMT configured to produce a 2-DEG. According to one implementation, for example, III-nitride power transistor 110, for example a III-nitride field-effect transistor (III-N FET) or a III-nitride high electron mobility transistor (III-N HEMT), may be a high voltage (HV) device configured to sustain a drain voltage of approximately 600V and having a gate rating of approximately 40V. It is noted that in some implementations, composite semiconductor device 100 may utilize an insulated gate bipolar transistor (IGBT) as a power device in place of a III-nitride FET or HEMT.

LV device 120 is shown to include LV transistor 140 and LV diode 130. In one implementation, LV diode 130 may simply be a body diode of LV transistor 140, while in another implementation LV diode 130 may be a discrete diode coupled to LV transistor 140 as shown in FIG. 1 to produce LV device 120. LV device 120 may be implemented as an LV group IV device, such as an LV silicon device having a breakdown voltage of approximately 25V, for example. According to one implementation, LV device 120 may be an LV FET, such as an LV silicon MISFET or MOSFET, for example, including LV body diode 130.

The cascoded combination of III-nitride power transistor 110 and LV device 120 produces composite semiconductor device 100, which according to the implementation shown in FIG. 1 results in a composite three terminal device functioning in effect as a FET having composite source 102 and composite gate 106 provided by LV device 120, and composite drain 104 provided by III-nitride power transistor 110. Moreover, and as will be described in greater detail below, composite semiconductor device 100 may be implemented as an HV composite device configured to have active oscillation control.

Figure 2:
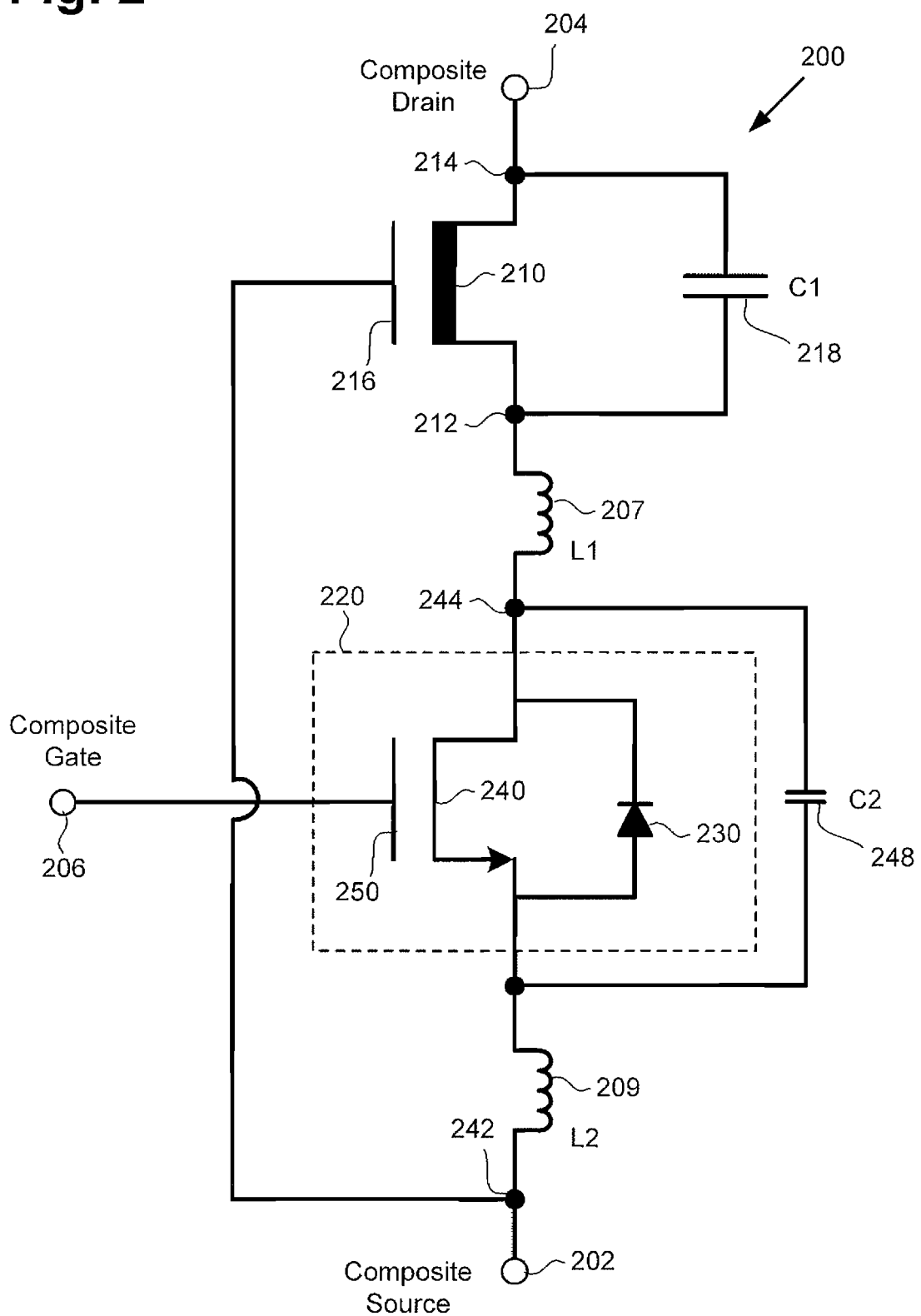
FIG. 2 shows a more detailed implementation of a composite semiconductor device with active oscillation control, corresponding generally to the implementation shown by FIG. 1.

Continuing to FIG. 2, FIG. 2 shows a more detailed implementation of a composite semiconductor device with active oscillation control, corresponding generally to the implementation shown by FIG. 1. Composite semiconductor device 200 includes III-nitride power transistor 210, which can be for example a III-N PET or a III-N HEMT, and LV device 220 cascoded with III-nitride power transistor 210. As further shown in FIG. 2, LV device 220 includes LV transistor 240 and LV diode 230, which may be a body diode of LV transistor 240, for example. Also shown in FIG. 2 are composite source 202, composite drain 204, and composite gate 206 of composite semiconductor device 200, as well as output capacitance 218 (C1) measured across III-nitride power transistor 210, output capacitance 248 (C2) measured across LV device 220 (e.g., LV transistor 240 having LV body diode 230), and semiconductor package inductances 207 (L1) and 209 (L2).

Composite semiconductor device 200 having composite source 202, composite drain 204, composite gate 206, and formed from III-nitride power transistor 210 in combination with LV device 220 including LV transistor 240 and LV diode 230 corresponds to composite semiconductor device 100 having composite source 102, composite drain 104, composite gate 106, and formed from III-nitride power transistor 110 in combination with LV device 120 including LV transistor 140 and LV diode 130, in FIG. 1, and may share any of the features previously attributed to the corresponding components of composite semiconductor device 100 and described above.

As shown in FIG. 2, LV transistor 240 is cascoded with III-nitride power transistor 210 to produce composite semiconductor device 200. That is to say, drain 244 of LV transistor 240 is coupled to source 212 of III-nitride power transistor 210, source 242 of LV transistor provides composite source 202 for composite semiconductor device 200, and gate 250 of LV transistor 240 provides composite gate 206 for composite semiconductor device 200. In addition, drain 214 of III-nitride power transistor 210 provides composite drain 204 for composite semiconductor device 200, while gate 216 of III-nitride power transistor 210 is coupled to source 242 of LV transistor 240.

The operation of composite semiconductor device 200 implemented as a normally OFF device formed from LV transistor 240 cascoded with normally ON III-nitride power transistor 210 will now be described by reference to that specific, but merely exemplary, implementation. As previously noted above, in the absence of the active oscillation control disclosed herein, a composite semiconductor device such as composite semiconductor device 200 may be susceptible to oscillations in some high current applications. During high slew rate conditions, for example, source 212 of III-nitride power transistor 210 may oscillate when configured in series with the circuit including output capacitance 218, semiconductor package inductance 207, and output capacitance 248, (e.g., C1-L1-C2) of FIG. 2. Oscillation of source 212 may cause gate 216 of III-nitride power transistor 210 to oscillate as well, which can, in turn, cause normally ON III-nitride power transistor 210 to be switched OFF and ON undesirably. Unless controlled, those oscillations can be destructive.

In some implementations, the described oscillation phenomenon can be controlled by optimally reducing semiconductor package inductance 207 (L1) and/or 209 (L2). In one implementation, for instance, semiconductor package inductance 207, and semiconductor package inductance 209 (L2), may be reduced using a die-on-die configuration. Specific examples for implementing a die-on-die configuration are disclosed in U.S. Provisional Application No. 61/448,347 entitled "III-Nitride Transistor Stacked with FET in a Package," filed on Mar. 2, 2011, as well as in Provisional Patent Application No. 61/448,617 entitled "III-Nitride Transistor Stacked with Diode in a Package," filed on Mar. 2, 2011, both of which are hereby incorporated by reference in their entirety.

According to another implementation, semiconductor package inductances 207 and 209 may be reduced through monolithic integration of III-nitride power transistor 210 and LV device 220. For example, III-nitride power transistor 210 and LV device 220 may be monolithically integrated as disclosed in U.S. patent application Ser. No. 12/455,117, entitled "Monolithic Vertically Integrated Composite Group III-V and Group IV Semiconductor Device and Method for Fabricating Same", filed on May 28, 2009 and issued as U.S. Pat. No. 7,915,645 on Mar. 29, 2011; as well as by U.S. patent application Ser. No. 12/653,240, entitled "Highly Conductive Source/Drain Contacts in III-Nitride Transistors", filed on Dec. 10, 2009; U.S. patent application Ser. No. 12/928,103, entitled "Monolithic Integration of Silicon and Group III-V Devices", filed on Dec. 3, 2010; and U.S. patent application Ser. No. 13/020,243 entitled "Efficient High Voltage Switching Circuits and Monolithic Integration of Same", filed on Feb. 3, 2011, each of which is hereby incorporated by reference in its entirety.

Alternatively, and as disclosed herein, undesirable oscillations by composite semiconductor device 200 may be reduced or eliminated through implementation of an active oscillation control, which may be effectuated through configuration of LV transistor 240 to have a reduced output resistance and/or a reduced transconductance due to a modified oxide thickness ($T_{OX}$). That is to say, in those applications where composite semiconductor device 200 is designed for high current operation, it may be advantageous to optimize (e.g., limit) the gain (A) of composite semiconductor device 200 from a small signal modeling perspective to less than approximately ten thousand (10,000) in order to provide for stability. For example, LV transistor 240 can be designed and formed such that one or both of the output resistance of LV transistor 240 and the transconductance partially determined by $T_{OX}$ of LV transistor 240 are optimized so as to limit the gain of composite semiconductor device to a range from approximately 1.0 to less than approximately 10,000, in order to provide active oscillation control for composite semiconductor device 200. It is noted that, more generally, the expression "oxide thickness" or $T_{OX}$ may refer to the thickness or effective thickness of any suitable gate dielectric utilized to capacitively couple gate 250 of LV transistor 240 to a body region of LV transistor 240 (body region not shown in FIG. 2). Thus, as used herein, $T_{OX}$ may refer to gate dielectrics other than oxides.

Figure 3:
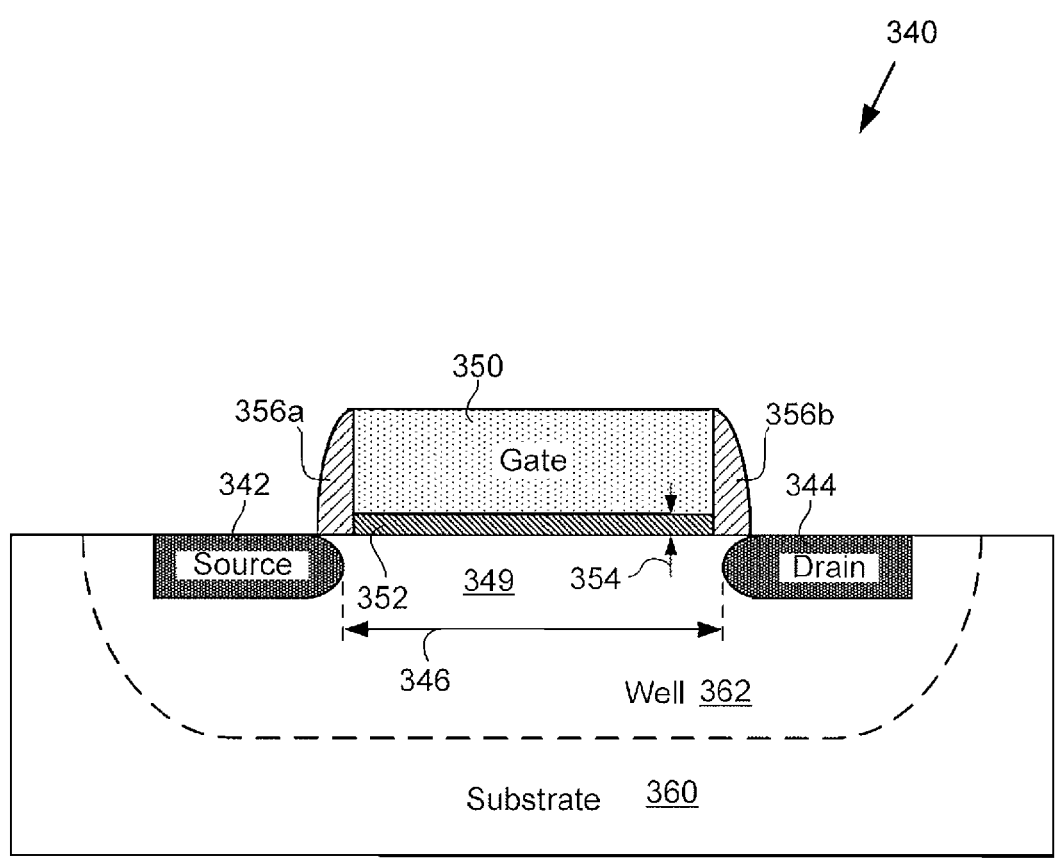
FIG. 3 shows a cross-sectional view of one implementation of a low voltage (LV) transistor suitable for use in a composite semiconductor device and configured to provide active oscillation control.

Referring now to FIG. 3, FIG. 3 shows a cross-sectional view of one implementation of LV transistor 340 suitable for use in a composite semiconductor device and configured to provide active oscillation control. As shown in FIG. 3, LV transistor 340 is situated in well 362 formed in substrate 360, and includes source 342, drain 344, and gate 350. As further shown in FIG. 3, LV transistor 340 also includes gate dielectric 352 having thickness (e.g., $T_{OX}$) 354, spacers 356a and 356b, and body region 346 having body implant 349. LV transistor 340 including source 342, drain 344, and gate 350 corresponds to LV transistor 240 including source 242, drain 244, and gate 250, in FIG. 2.

According to the implementation shown in FIG. 3, LV transistor 340 is represented as a FET. When implemented as such, LV transistor 340 may be fabricated as an n-channel device (NFET) or p-channel device (PFET). Although for the purposes of the present discussion LV device 340 will be described as an NFET, that example characterization is not to be interpreted as a limitation.

When LV transistor 340 is implemented as an NFET, well 362 may be a P type well formed in substrate 360, which may include an epitaxial region formed on a silicon substrate, for example (epitaxial region not distinguished as such in FIG. 3). Moreover, in such an implementation, source 342 and drain 344 may be heavily doped N+ regions, while body region 346 may include a P type body implant 349, such as a boron implant, for example. Gate 350 may be formed of a suitable gate metal, or of a doped polysilicon, for example, while gate dielectric 352 may be formed of a gate oxide, such as silicon oxide ($SiO_2$) or, alternatively, a low-k dielectric in various implementations to achieve an increased $T_{OX}$, as discussed further below. Spacers 356a and 356b can be silicon nitride ($Si_3N_4$) spacers, for example, and can be formed using any suitable technique, as known in the art.

As discussed above, it may be advantageous to reduce the gain (A) of composite semiconductor device 200, in FIG. 2, to less than approximately 10,000 in order to enhance its resistance to undesirable oscillations. That may be achieved through reduction of the transconductance (gin) of composite semiconductor device 200, which includes the transconductance of LV transistor 240 ($gm_{LV}$) as well as the transconductance of III-nitride power transistor 210 ($gm_{III-N}$). For example, the small signal gain of composite semiconductor 200 may be described by Equation 1:

$$A = (gm_{LV})*(gm_{III-N})*(r_{O-LV})*(r_{O-III-N}) \qquad \text{Equation 1:}$$

where $r_{O-LV}$ is the output resistance of LV transistor 240 and $r_{O-III-N}$ is the output resistance of III-nitride power transistor 210.

In order to reduce or eliminate oscillations and render composite semiconductor device 200 substantially stable, the gain (A) may be reduced and optimized, such as by being limited to less than approximately 10,000, for example. Such a reduction in the gain can be achieved through reduction of one or more of the gain components appearing in Equation 1, i.e., one or more of $gm_{LV}$, $gm_{III-N}$, $r_{O-LV}$, and $r_{O-III-N}$. For example, LV transistor 240 may have a transconductance ($gm_{LV}$) in a range from approximately 1.0 mho to approximately 50.0 mhos and an output resistance ($r_{O-LV}$) in a range from approximately 0.4Ω to approximately 20.0Ω, while III-nitride power transistor 210 may have a transconductance ($gm_{III-N}$) in a range from approximately 10.0 mhos to approximately 500.0 mhos and an output resistance ($r_{O-III-N}$) in a range from approximately 0.1Ω to approximately 5.0Ω, with the additional constraint that the product: $[(gm_{LV})*(gm_{III-N})*(r_{O-LV})*(r_{O-III-N})]$ yield a gain of less than 10,000, such as a gain as low as approximately 1.0.

With respect to $gm_{LV}$, the proportionality relationship of $gm_{LV}$ to $T_{OX}$ is described by Equation 2:

$$gm_{LV} \propto 1/T_{OX}; \qquad \text{Equation 2:}$$

Thus, modifying the oxide thickness by increasing $T_{OX}$ decreases $gm_{LV}$ and consequently the gain (A) of composite semiconductor device 200. As a result, LV transistor 240 can provide active oscillation control for composite semiconductor device 200 by being configured so as to have a gain limiting (e.g., increased) $T_{OX}$.

Referring to FIG. 3, gate dielectric thickness 354 corresponding to $T_{OX}$ can be increased either in effect, or in fact, to provide active oscillation control for the composite semiconductor device including LV transistor 340. An increase in fact of gate dielectric thickness 354 may be accomplished by fabricating LV transistor 340 to have increased gate dielectric thickness 354. Alternatively, an increase in effect of gate dielectric thickness 354 may be accomplished by fabricating LV transistor 340 to include a low-k gate dielectric 352, such as, by way of examples and without limitation, porous silica, fluorinated amorphous carbon, aromatic hydrocarbon, carbon-doped oxide, parylene, polyarylene ether, silsesquioxane, fluorinated silicon dioxide, and diamondlike carbon.

Referring once again to Equation 1, another possible gain limiting component is the output resistance of LV transistor 340, i.e., $r_{O-LV}$. As may be understood, $r_{O-LV}$ can be reduced in order to reduce or eliminate oscillations in the composite semiconductor device including LV transistor 340 by fabricating LV transistor 340 so as to have a gain limiting body implant as body implant 349. For example, in the described exemplary NFET implementation, the energy and dosage of the boron implant used to produce body implant 349 can be modified to reduce the output resistance $r_{O-LV}$ of LV transistor 340.

Thus, by utilizing an LV device having one or both of a reduced output resistance and a reduced transconductance due to a modified oxide thickness, and cascoding the LV device with a III-nitride power transistor, the present application discloses implementations of composite semiconductor devices with active oscillation control. As a result, an LV group IV device can be advantageously cascoded with a normally ON III-nitride power transistor to produce a rugged, normally OFF HV composite device displaying high durability and stable operation in high current applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A normally OFF composite semiconductor device including an active oscillation control, said normally OFF composite semiconductor device comprising:
 a normally ON III-nitride power transistor;
 a low voltage (LV) device cascoded with said normally ON III-nitride power transistor to form said normally OFF composite semiconductor device;
 said LV device having a reduced output resistance to cause a gain of said normally OFF composite semiconductor device to be less than approximately 10,000.

2. The normally OFF composite semiconductor device of claim 1, wherein said normally ON III-nitride power transistor comprises a III-nitride high electron mobility transistor (III-N HEMT).

3. The normally OFF composite semiconductor device of claim 1, wherein said LV device comprises an LV group IV semiconductor device.

4. The normally OFF composite semiconductor device of claim 1, wherein said LV device comprises an LV field-effect transistor (LV FET).

5. The normally OFF composite semiconductor device of claim 1, wherein said normally ON III-nitride power transistor and said LV device are monolithically integrated.

6. A composite semiconductor device including an active oscillation control, said composite semiconductor device comprising:
 a III-nitride power transistor;
 a low voltage (LV) transistor;
 a drain of said LV transistor coupled to a source said III-nitride power transistor, a source of said LV transistor providing a composite source for said composite semiconductor device, and a gate of said LV transistor providing a composite gate for said composite semiconductor device, a drain of said III-nitride power transistor providing a composite drain for said composite semiconductor device, a gate of said III-nitride power transistor being coupled to said source of said LV transistor;
 said LV transistor having a reduced output resistance due to a modified body implant to cause a gain of said composite semiconductor device to be less than approximately 10,000.

7. The composite semiconductor device of claim 6, wherein said III-nitride power transistor comprises a III-nitride high electron mobility transistor (III-N HEMT).

8. The composite semiconductor device of claim 6, wherein said LV transistor comprises an LV group IV semiconductor transistor.

9. The composite semiconductor device of claim 6, wherein said LV transistor comprises an LV silicon field-effect transistor (FET).

10. The composite semiconductor device of claim 6, wherein said LV transistor is one of an LV metal-oxide-semiconductor FET (LV MOSFET) and an LV metal-insulator-semiconductor FET (LV MISFET).

11. The composite semiconductor device of claim 6, wherein said III-nitride power transistor and said LV transistor are monolithically integrated.

12. A composite semiconductor device including an active oscillation control, said composite semiconductor device comprising:
 a III-nitride power transistor;
 a low voltage (LV) transistor;
 a drain of said LV transistor coupled to a source said III-nitride power transistor, a source of said LV transistor providing a composite source for said composite semiconductor device, and a gate of said LV transistor providing a composite gate for said composite semiconductor device, a drain of said III-nitride power transistor providing a composite drain for said composite semiconductor device, a gate of said III-nitride power transistor being coupled to said source of said LV transistor;
 said LV transistor having a reduced transconductance due to a modified oxide thickness to cause a gain of said composite semiconductor device to be less than approximately 10,000.

13. The composite semiconductor device of claim 12, wherein said III-nitride power transistor comprises a III-nitride high electron mobility transistor (III-N HEMT).

14. The composite semiconductor device of claim 12, wherein said LV transistor comprises an LV group IV semiconductor transistor.

15. The composite semiconductor device of claim 12, wherein said LV transistor comprises an LV silicon field-effect transistor (FET).

16. The composite semiconductor device of claim 12, wherein said LV transistor is one of an LV metal-oxidesemiconductor FET (LV MOSFET) and an LV metal-insulator-semiconductor FET (LV MOSFET).

17. The composite semiconductor device of claim 12, wherein said HI-nitride power transistor and said LV transistor are monolithically integrated.

\* \* \* \* \*

UNITED STATES PATENT AND TRADEMARK OFFICE
CERTIFICATE OF CORRECTION

| | | |
|---|---|---|
| PATENT NO. | : 8,766,375 B2 | Page 1 of 1 |
| APPLICATION NO. | : 13/417143 | |
| DATED | : July 1, 2014 | |
| INVENTOR(S) | : Bramian et al. | |

It is certified that error appears in the above-identified patent and that said Letters Patent is hereby corrected as shown below:

Title page, add item [63] --Related U.S. Application Data Provisional application No. 61/454,743, filed on Mar. 21, 2011--.

Signed and Sealed this
Twenty-first Day of October, 2014

Michelle K. Lee
*Deputy Director of the United States Patent and Trademark Office*